United States Patent [19]

Nishizawa et al.

[11] Patent Number: 5,169,795

[45] Date of Patent: Dec. 8, 1992

[54] METHOD OF MANUFACTURING STEP CUT TYPE INSULATED GATE SIT HAVING LOW-RESISTANCE ELECTRODE

[75] Inventors: Jun-ichi Nishizawa; Nobuo Takeda, both of Sendai, Japan

[73] Assignee: Small Power Communication Systems Research Laboratories Co., Ltd., Sendai, Japan

[21] Appl. No.: 747,699

[22] Filed: Aug. 20, 1991

Related U.S. Application Data

[62] Division of Ser. No. 483,740, Feb. 23, 1990, Pat. No. 5,060,029.

[30] Foreign Application Priority Data

Feb. 28, 1989 [JP] Japan ..................... 1-45292
Feb. 28, 1989 [JP] Japan ..................... 1-45293

[51] Int. Cl.⁵ .................... H01L 21/265; H01L 21/44
[52] U.S. Cl. ........................... 437/41; 437/192; 437/193; 437/203
[58] Field of Search ............... 437/40, 41, 39, 42, 437/43, 54, 56; 357/23.5, 51

[56] References Cited

U.S. PATENT DOCUMENTS

| | | | |
|---|---|---|---|
| 4,407,059 | 10/1983 | Sasaki | 437/55 |
| 4,454,526 | 6/1984 | Nishizawa et al. | 357/23.4 |
| 4,764,480 | 8/1988 | Vora | 437/56 |
| 4,851,889 | 7/1989 | Matsuzaki | 357/23.5 |
| 5,047,812 | 9/1991 | Pfiester | 357/23.4 |

FOREIGN PATENT DOCUMENTS

| | | |
|---|---|---|
| 61-284967 | 12/1986 | Japan . |
| 63-128674 | 6/1988 | Japan . |
| 63-128675 | 6/1988 | Japan . |
| 63-280450 | 11/1988 | Japan .................... 437/41 |

Primary Examiner—Olik Chaudhuri
Assistant Examiner—Loc Q. Trinh
Attorney, Agent, or Firm—Oblon, Spivak, McClelland, Maier & Neustadt

[57] ABSTRACT

This invention provides a step cut type insulated gate static induction transistor having a first main electrode formed in one major surface of a semiconductor substrate, a second main electrode formed in a bottom portion of a U-shaped groove formed in one major surface of a semiconductor substrate, a control electrode formed on a side wall of the U-shaped groove and consisting of a thin insulating film and a polysilicon layer, and a low-resistance electrode of a refractory metal layer or a refractory metal silicide layer formed in at least part of the side wall of the polysilicon layer of the control electrode.

9 Claims, 9 Drawing Sheets

|  | SHEET RESISTANCE ($\Omega/\square$) |
|---|---|
| $n^+$-TYPE POLYSILICON | 41.0 |
| $p^+$-TYPE POLYSILICON | 130.6 |
| TITANIUM SILICIDE | 1.27 |

METHOD OF MANUFACTURING STEP CUT TYPE INSULATED GATE SIT HAVING LOW-RESISTANCE ELECTRODE

This is a division of application Ser. No. 07/483,740, filed on Feb. 23, 1990, now U.S. Pat. No. 5,060,029.

BACKGROUND OF THE INVENTION

1. Field of the Invention

The present invention relates generally to a step cut type insulated gate SIT (static induction transistor) applicable to a high-frequency amplifier or an integrated circuit, and more particularly to a structure and manufacturing method of a step cut type insulated gate SIT, wherein a conductive layer formed of either a refractory metal or a refractory metal silicide is formed on part of the side surface of a gate electrode manner, thereby reducing the resistance of the gate electrode and enabling a high-speed operation and low power dissipation. The present invention relates also to a structure and a manufacturing method of a step cut type insulated gate SIT, wherein a conductive layer formed of either a refractory metal or a refractory metal silicide is formed not only on the surface of a gate electrode but also on the surface of a source/drain region manner, thereby reducing the resistance of the source/drain region as well and enabling a higher-speed operation and lower power dissipation.

2. Description of the Related Art

An insulated gate FET is generally employed in a high-frequency amplifier or an integrated circuit. This insulated gate FET has the following defects. First, a transconductance is small because a current path is limited to a thin region near an interface between a semiconductor and an insulating film. Second, a gate input capacitance is large. Thus, a switching speed cannot be increased due to the time constant defined by these two.

As a general means for solving these defects, a channel of the insulated gate SIT is shortened. However, this countermeasure is not sufficient, and various transistors having other structures have been proposed. These proposals include, for example, an "insulated gate static induction transistor" and a "step cut type insulated gate SIT" described in Published Unexamined Japanese Patent Applications Nos. 52-1756 (U.S. Pat. No. 4,814,839) and 52-13707, respectively.

Features of these transistors provide excellent performance of a high-speed switching device or an device for a high-speed and low-power dissipation IC.

The insulated gate SIT designed so that a drain electric field reaches a source has an non-saturating current-voltage characteristics and a large transconductance, since a current flows not only near an interface between a semiconductor substrate and an insulating film, but also through the substrate. The step cut type insulated gate SIT has good controllability for a channel length or a gate length and is suitable for a short channel, since a channel is formed in a direction of depth of the semiconductor substrate.

In the step cut type insulated gate SIT, however, a gate electrode is formed on the side wall of a U-shaped groove by polysilicon. Therefore, since the gate series resistance of this transistor is large, a switching speed is limited by the time constant defined by the gate series resistance and the input capacitance.

Moreover, as the thickness of the drain and source regions must be thin, the resistance is not sufficiently small. Since wiring layers consisting of Al or an Al-Si alloy directly contact these regions, a contact resistance is not sufficiently small, too. This is a reason for increasing power dissipation.

SUMMARY OF THE INVENTION

It is the first object of the present invention to reduce the propagation delay time of a step cut type insulated gate static induction transistor. The present invention provides a step cut type insulated gate static induction transistor having a U-shaped groove formed on a major surface of a semiconductor substrate, a first main electrode formed on the surface, a second main electrode formed in a bottom portion of the U-shaped groove, a control electrode formed on a side wall of the U-shaped groove and consisting of a thin insulating film and a polysilicon layer, and a low-resistance electrode of a refractory metal layer or a refractory metal silicide layer formed in at least part of the side wall of the polysilicon layer of the control electrode, wherein a gate series resistance is decreased, to thereby largely reduce a propagation delay time.

It is the second object of the present invention to provide an easy and reproducible fabrication, a step cut type insulated gate static induction transistor which employs such a low-resistance control electrode as mentioned above. According to the present invention, a U-shaped groove is formed in a major surface of a semiconductor substrate by anisotropic etching, and a thin insulating film is formed on the entire surface of the semiconductor substrate. A polysilicon film is formed on the insulating film, and then a refractory metal or metal silicide layer is formed on the polysilicon layer. The polysilicon layer and the refractory metal or metal silicide layer are removed by anisotropic etching so as to refrain these layers on only the side wall portion of the U-shaped groove. A control electrode, at least part of which is a low-resistance electrode, is formed. First and second electrodes are respectively formed in the major surface and the bottom portion of the U-shaped groove. By use of this method, a step cut type static induction transistor having a low-resistance control electrode, such as that mentioned above, can be easily fabricated with good reproducibility.

It is the third object of the present invention to improve the power dissipation of a step cut type insulated gate static induction transistor which employs such a low-resistance control electrode as mentioned above. In accordance with this object, the present invention is intended to provide a step cut type insulated gate static induction transistor wherein a low-resistance electrode formed of either a refractory metal or a refractory metal silicide is provided for not only a control electrode but also the surfaces of the first and second main electrodes, to thereby reduce the propagation delay time and improve the power dissipation.

It is the fourth object of the present invention to provide a easy and reproducible fabrication method of a step cut type insulated gate static induction transistor wherein the resistance of the first and second main electrodes is further reduced, as mentioned above. According to this method, a U-shaped groove is formed in a major surface of a semiconductor substrate, a thin insulating film is formed on the surface of the semiconductor substrate, a two-layered film consisting of a polysilicon layer and a silicon nitride film is formed thereon, and the deposited films are continuously removed so as to retain them on only a side wall portion of the U-shaped groove, thereby forming a control electrode. By use of both local oxidation and enhanced oxidation, insulating film spacers are formed only at part of a lower portion of the side wall of the polysilicon layer and an upper portion thereof. The silicon nitride film is removed, and first and second main electrodes are respectively formed in the major surface and the bottom portion of the U-shaped groove. In addition, a refractory metal layer is formed on the semiconductor substrate. Thereafter, selective silicidation is performed to remove the refractory metal layer, except for those portions located on the first and second main electrodes and on the polysilicon layer. In this way, there is provided an easy and reproducible fabrication method of a step cut type insulated gate static induction transistor wherein both the first and second main electrodes and the control electrode are provided with a low-resistance electrode.

Additional objects and advantages of the invention will be set forth in the description which follows, and in part will be obvious from the description, or may be learned by practice of the invention. The objects and advantages of the invention ma be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be described below with reference to the accompanying drawings.

Figure 1:
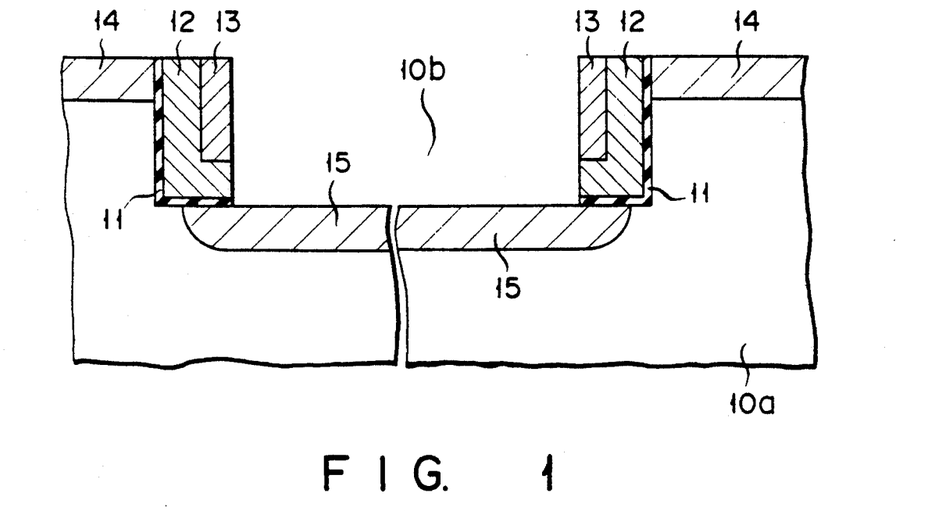
FIG. 1 is a sectional view showing a structure of a step cut type insulated gate SIT according to the first embodiment of the present invention.

FIG. 1 shows a sectional structure of a step cut type insulated gate SIT according to the first embodiment of the present invention. In this embodiment, a step cut type insulated gate SIT is formed on only one side wall. However, there is a case where such a step cut insulated gate SIT is formed on each side wall. A U-shaped groove 10b is formed on a major surface of a high-resistive Si (100) substrate 10a. Thin insulating films 11 are formed on the side wall of the groove 10b, and polysilicon gate electrodes 12 are formed thereon. Low-resistance electrodes 13 consisting of a refractory metal or a refractory metal silicide are formed on at least portions of the side wall of the gate electrodes 12, respectively.

An n-type drain region 14 having high impurity concentration is formed in the major surface and an n-type source region 15 having high impurity concentration is formed in the bottom of the groove 10b, respectively; alternatively the region 14 can be used as a source.

The high-resistive Si substrate 10a sandwiched between the drain and source regions serves as a channel.

This channel may have a p or n conductivity type, but the impurity concentration of the channel must have a value causing the channel to be satisfactorily depleted in a certain operating condition. (The phrase "in a certain operating condition" is intended to mean that the channel is satisfactorily depleted at least when a specific bias is applied.)

In the step cut type insulated gate SIT shown in FIG. 1, a threshold voltage of the transistor is almost equal to the conventional transistor due to the presence of the gate electrodes 12, and a gate series resistance can be largely reduced in a direction perpendicular to the drawing surface (the drawing surface has an X-Y plane, and a Z-axis direction is set to be perpendicular to the X-Y plane hereinafter) due to the presence of the low-resistance electrodes 13.

FIGS. 2A to 2D show the steps for fabricating the step cut type insulated gate SIT shown in FIG. 1 according to the first embodiment of the present invention.

Note that only one side wall of the U-shaped groove is representatively shown.

Figures 2A, 2B:
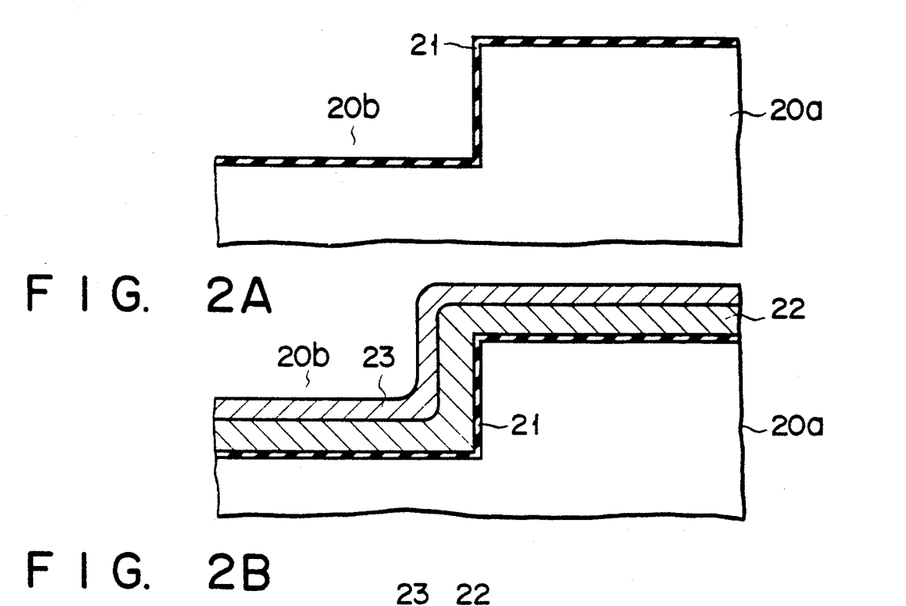
FIGS. 2A to 2D are sectional views showing the steps for fabricating the SIT according to the first embodiment of the present invention.

In the step shown in FIG. 2A, a major surface of a high-resistance Si substrate 20a is selectively removed by anisotropic plasma etching to form a U-shaped groove 20b. Thereafter, a thin gate oxide film 21 is grown on the Si substrate 20a. In this case, an Si (100) substrate having an impurity concentration of $10^{11}$ cm$^{-3}$ to $10^{14}$ cm$^{-3}$ is generally used as the Si substrate 20a.

Impurities can be doped in a portion serving as a channel with an impurity concentration of about $10^{12}$ cm$^{-3}$ to $10^{17}$ cm$^{-3}$. The impurity concentration of the channel must have a value defined such that the channel is satisfactorily depleted in a certain normal operation condition. The U-shaped groove 20b having a depth of about 0.1 μm to 1 μm is formed by anisotropic plasma etching using phosphorus trichloride (PCl$_3$) as an etching gas or the like. The gate oxide film 21 is formed to have a thickness of about 5 nm to 100 nm.

In the step shown in FIG. 2B, a polysilicon film 22 is grown on the gate oxide film 21 by CVD (Chemical Vapor Deposition method), and subsequently, a refractory metal film 23 is formed on the polysilicon film 22. In this case, the polysilicon film 22 having a thickness of about 0.1 to 0.5 μm can be grown by SiH$_4$/H$_2$ CVD system. At the same time, impurities can be doped in the polysilicon film 22 by PH$_3$ or B$_2$H$_6$.

Molybdenum (Mo), tungsten (W), titanium (Ti), tantalum (Ta) or the like is suitable for the refractory metal film 23, and the refractory metal film 23 is formed to have a thickness of about 0.05 μm to 0.5 μm. The film consisting of such a metal material can be formed by not only CVD method, but also sputtering or evaporation. However, considering formation of a thin film on the side wall of U-shaped groove, CVD method is most suitable for forming the film. The refractory metal film 23 can also be formed by, e.g., tungsten hexafluoride/-hydrogen (WF$_6$/H$_2$) CVD system or tungsten hexafluoride/silane (WF$_6$/SiH$_4$) CVD system.

Figure 2C:
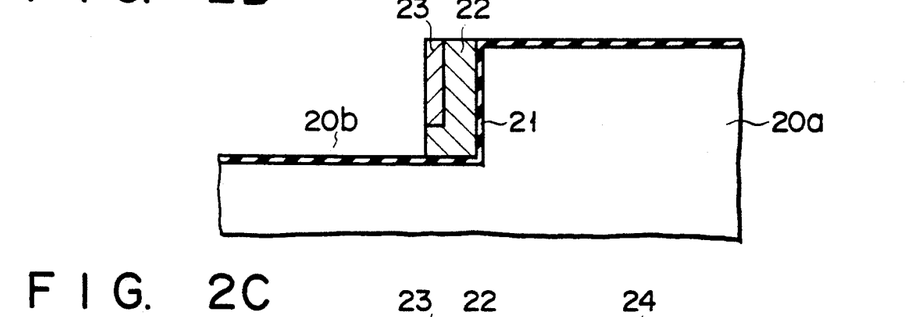

In the step shown in FIG. 2C, the refractory metal film 23 and the polysilicon film 22 are sequentially removed by anisotropic etching, and the refractory metal film 23 and the polysilicon film 22 are retained on only the side wall of the U-shaped groove 20b. In addition, the resultant structure may be heated by lamp annealing or the like to convert the refractory metal film 23 to a silicide. In particular, if titanium is converted to a silicide, its resistance can be reduced.

Figure 2D:
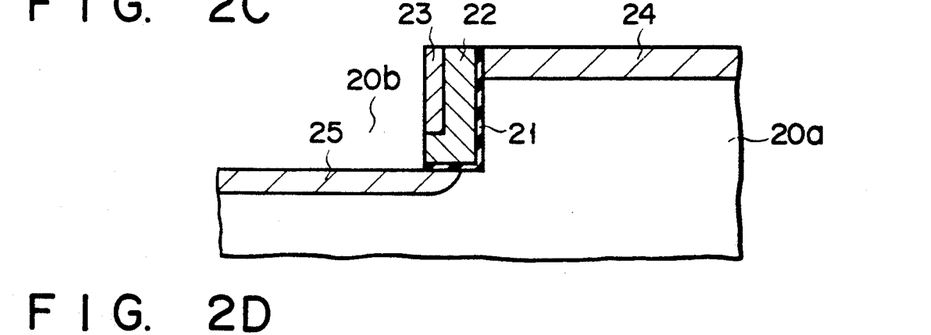

In the step shown in FIG. 2D, the Si substrate is subjected to ion implantation or thermal diffusion to form regions (source and drain) 24 and 25 each having an impurity concentration of about $10^{18}$ cm$^{-3}$ to $10^{21}$ cm$^{-3}$.

Therefore, the polysilicon film and the refractory metal film are selectively removed, and the gate electrode and the drain and source electrodes can be formed with respect to the U-shaped groove.

Figure 3:
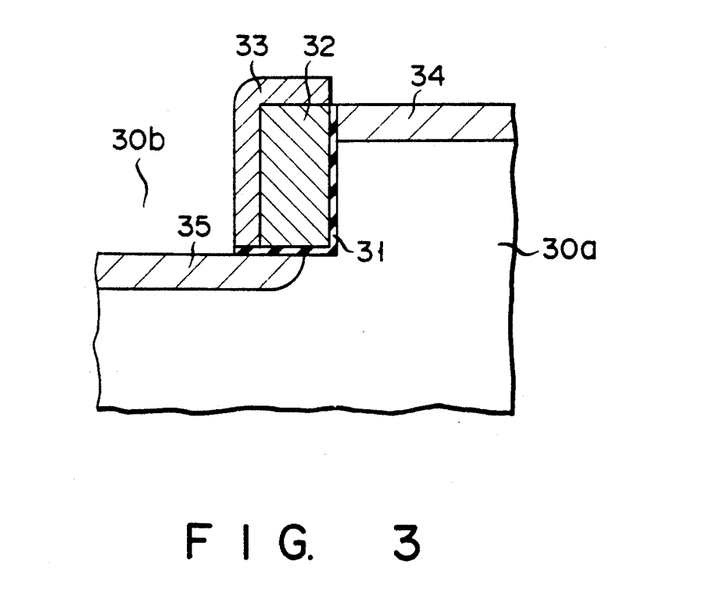
FIG. 3 is a sectional view showing a structure of a step cut type insulated gate SIT according to the second embodiment of the present invention.

FIG. 3 shows a sectional structure of a step cut type insulated gate SIT according to the second embodiment of the present invention. A U-shaped groove 30b is formed in a high-resistive Si substrate 30a in the same manner as the first embodiment. Each polysilicon gate electrode 32 is formed on the corresponding side wall of the groove 30b through a corresponding thin gate insulating film 31 formed thereon. Each low-resistance electrode 33 consisting of a refractory metal or a refractory metal silicide is formed to cover the side wall and the upper portion of the corresponding gate electrode 32. Regions (source and drain) 34 and 35 having an impurity concentration are formed by ion implantation or thermal diffusion.

FIGS. 4A to 4D show the steps in manufacturing the SIT according to the second embodiment of the present invention. Note that only one side wall of the U-shaped groove is representatively shown.

Figure 4A:
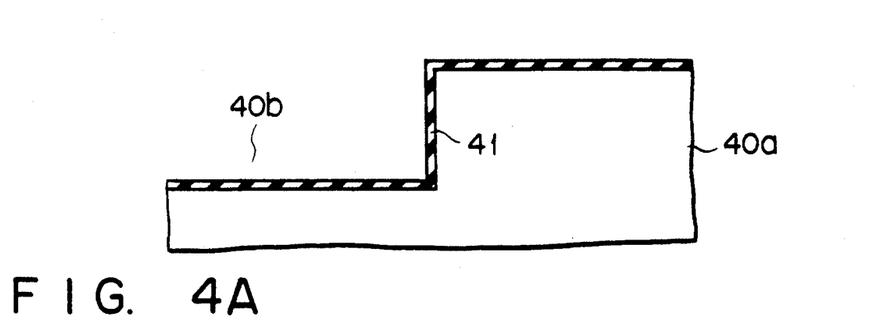
FIGS. 4A to 4D are sectional views showing the steps for fabricating the SIT according to the second embodiment of the present invention.

The step shown in FIG. 4A is the same as that in FIG. 2A. A major surface of a high-resistive Si substrate 40a is selectively removed by anisotropic plasma etching to form a U-shaped groove 40b. Thereafter, a thin gate oxide film 41 is grown on the Si substrate 40a.

Figure 4B:
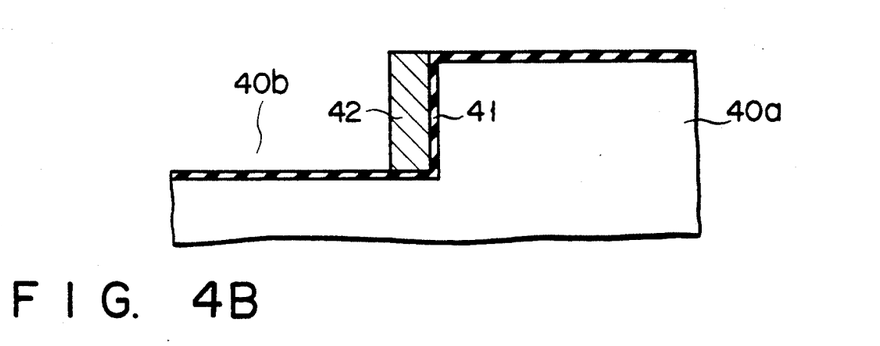

In the step shown in FIG. 4B, a polysilicon film 42 is deposited on the gate oxide film 41. Thereafter, the polysilicon film 42 is removed by anisotropic plasma etching to be retained on only the side wall of the U-shaped groove 40b.

Figure 4C:
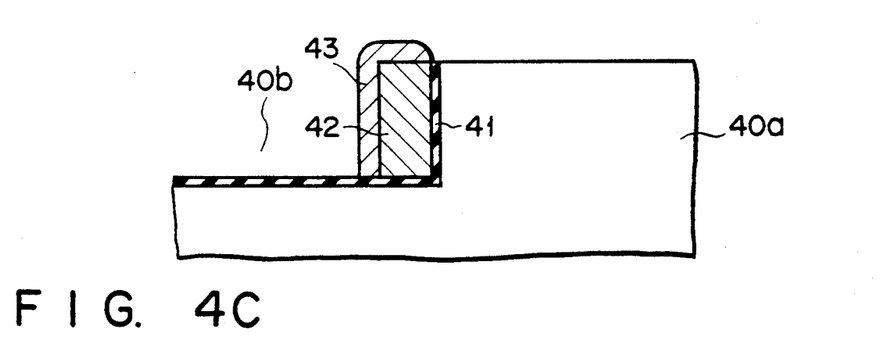

In the step shown in FIG. 4C, a refractory metal film 43 is selectively grown on only the polysilicon film 42 by selective CVD. Such selective growth is performed by WF$_6$/SiH$_4$ CVD system or the like. As in the step shown in FIG. 2C, the refractory metal film 43 may be converted to a silicide. If this is done, the resistance can be reduced.

Figure 4D:
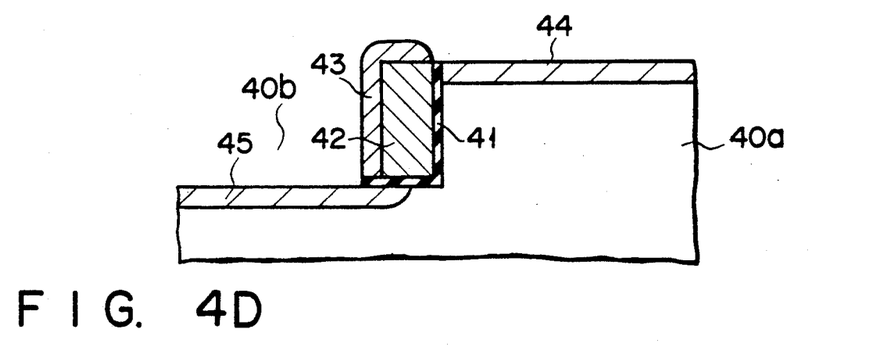

In the step shown in FIG. 4D, the Si substrate is subjected to ion implantation or thermal diffusion so as to form regions (source and drain) 44 and 45 each having an impurity concentration of about $10^{18}$ cm$^{-3}$ to $10^{21}$ cm$^{-3}$.

As another means for this step (not shown), the refractory metal film 43 is deposited on the entire surface of the polysilicon film 42 (not shown). Thereafter, the resultant structure is annealed, and the refractory metal film 43 contacting the polysilicon film 42 is selectively converted to a silicide. A portion of the refractory metal film which is not converted to a silicide is removed. In this step, the same structure as in the above-mentioned selective growing step can also be obtained.

Therefore, a polysilicon film is formed in advance, and a low-resistance electrode consisting of a refractory metal film or a refractory metal silicide film can be formed on only the polysilicon film by selective CVD or selective silicification.

Figure 5:
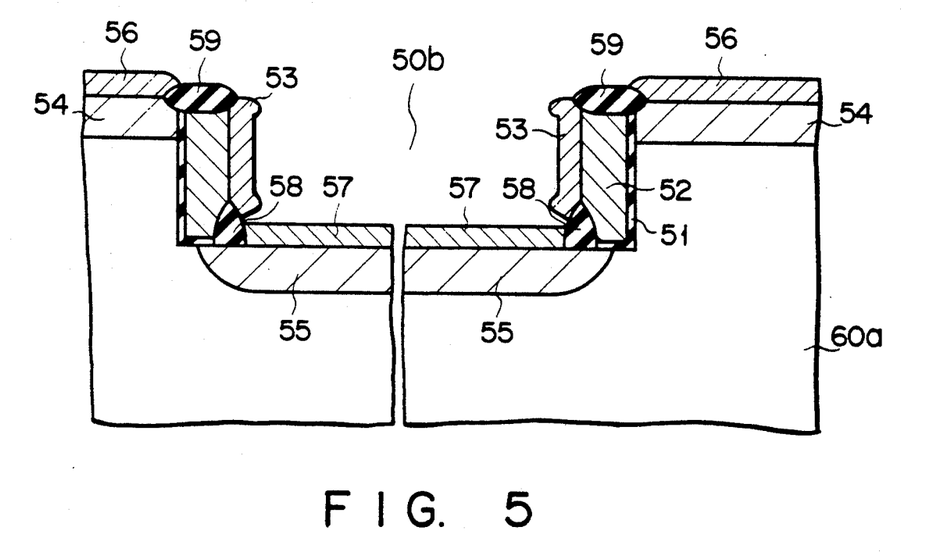
FIG. 5 is a sectional view showing a structure of the third embodiment of the present invention.

FIG. 5 shows a sectional structure of a step cut type insulated gate SIT according to the third embodiment of the present invention.

A U-shaped groove 50b is formed in a major surface of a high-resistance Si substrate 50a. Each polysilicon gate electrode 52 is formed on the corresponding side wall of the groove 50b through a corresponding thin gate insulating film 51 such as an oxide film. Each low-resistance electrode 53 consisting of a refractory metal or a refractory metal silicide is formed on at least a portion of the side wall of the corresponding gate electrode 52.

As in the first embodiment, for example, an n-type drain region 54 having high impurity concentration is formed in the major surface and an n-type source region 55 having high impurity concentration is formed in the bottom of the groove 50b, respectively; alternatively the region 54 can be used as a source. Low-resistance electrodes 56 and 57 consisting of a refractory metal or a refractory metal silicide are also formed on the drain and source regions. The low-resistance electrodes 53 and 57 are separated from each other by a corresponding spacer (the spacer consists of an insulating film such as an oxide film) 58 formed on the lower portion of the side wall of each gate electrode 52. Similarly, the low-resistance electrodes 53 and 56 are separated from each other by a corresponding spacer 59 formed on the upper portion of each gate electrode 52.

The high-resistive Si substrate 50a sandwiched between the drain and source regions serves as a channel.

This channel may have a p or n conductivity type, but the impurity concentration of the channel must have a value causing the channel to be satisfactorily depleted in a certain operating condition.

In the transistor according to the present invention, a threshold voltage is almost equal to the conventional transistor due to the presence of the gate electrode 52.

However, a gate series resistance can be largely decreased in a direction perpendicular to the drawing surface due to the presence of the low resistance electrode 53. In addition, since the low-resistance electrodes 56 and 57 are formed, the series resistance or contact resistance can be largely reduced.

FIGS. 6A to 6F show the steps in manufacturing the SIT according to the third embodiment shown in FIG. 5. Note that one side wall surface of the U-shaped groove is representatively shown.

Figure 6A:
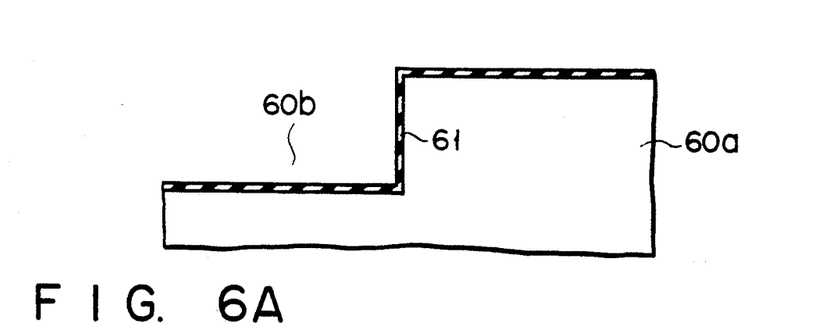
FIGS. 6A to 6F are sectional views showing the steps for fabricating an SIT according to the third embodiment shown in FIG. 5.

The step shown in FIG. 6A is the same as that shown in FIG. 2A. A major surface of a high-resistive Si substrate 60a is selectively removed by anisotropic plasma etching to form a U-shaped groove 60b. Thereafter, a thin gate oxide film 61 is grown on the Si substrate 60a. In this case, a (100) substrate having an impurity concentration of $10^{11}$ cm$^{-3}$ to $10^{14}$ cm$^{-3}$ is generally used as the Si substrate 60a.

Impurities can be doped in a portion serving as a channel with an impurity concentration of about $10^{12}$ cm$^{-3}$ to $10^{17}$ cm$^{-3}$. The impurity concentration of the channel must have a value defined such that the channel is satisfactorily depleted in a certain operating condition. The U-shaped groove 60b having a depth of about 0.1 μm to 1 μm is formed by anisotropic plasma etching using PCl$_3$ as an etching gas or the like. The gate oxide film 61 is formed to have a thickness of about 5 nm to 100 nm.

Figure 6B:
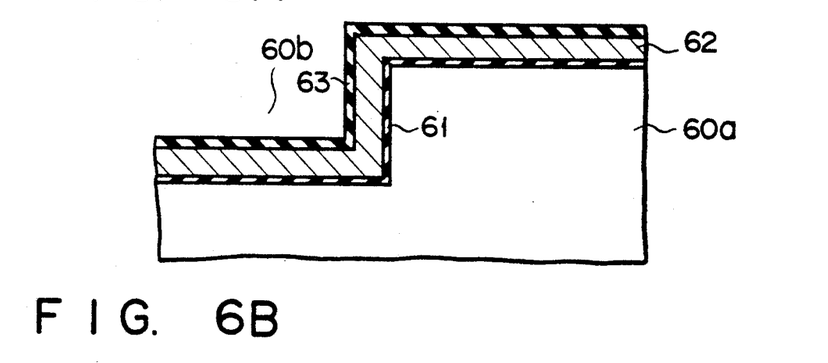

In the step shown in FIG. 6B, a polysilicon film 62 is deposited on the gate oxide film 61 by CVD method, and a Si$_3$N$_4$ film 63 is formed on the polysilicon film 62. In this case, the polysilicon film 62 having a thickness of about 0.1 to 0.5 μm can be grown by SiH$_4$/H$_2$ CVD system. At the same time, impurities can be doped in the polysilicon film 62 by PH$_3$ or B$_2$H$_6$. The Si$_3$N$_4$ film 63 having a thickness of about 0.05 μm to 0.2 μm can be formed by SiH$_4$/NH$_3$/H$_2$ CVD system or the like.

Figure 6C:
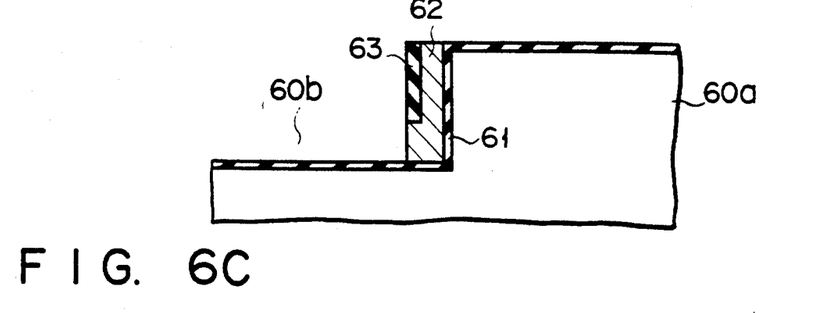

In the step shown in FIG. 6C, the Si$_3$N$_4$ film 63 and the polysilicon film 62 are sequentially removed by anisotropic plasma etching, and the Si$_3$N$_4$ film 63 and the polysilicon film 62 are retained on only the side wall of the U-shaped groove 60b. The Si$_3$N$_4$ film 63 can be removed by anisotropic plasma etching using C$_3$F$_8$ as an etching gas or the like. The polysilicon film 62 can be removed by anisotropic plasma etching using PCl$_3$ or the like.

Figure 6D:
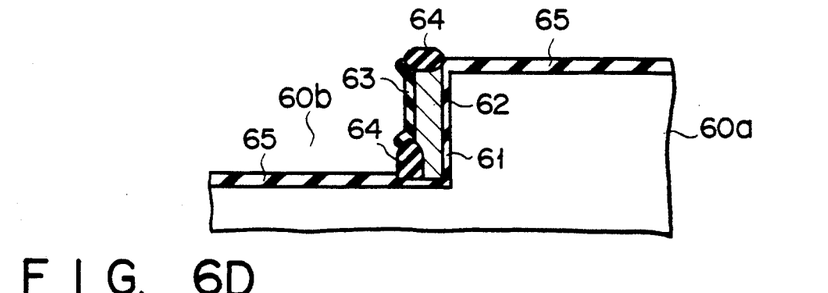

In the step shown in FIG. 6D, the Si substrate 60a is selectively oxidized using the Si$_3$N$_4$ film 63 as a mask to form oxide films 64 and 65. In this case, since the polysilicon film 62 has a high impurity concentration, the oxide films 64 at the upper and lower portions of the side wall are enhanced-oxidized. In this enhanced oxidization, it is well-known that an growth ratio of about 2 : 1 can be obtained between the polysilicon film 62 having a high-impurity concentration and the high-resistive Si (100) substrate 60a.

Figure 6E:
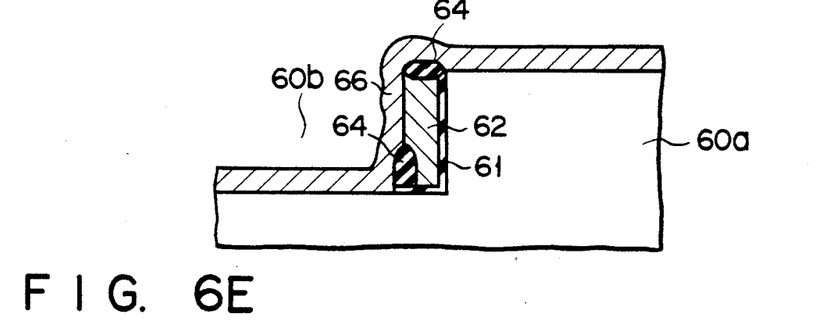

In the step shown in FIG. 6E, the oxide film 65 is removed such that only the oxide film 64 remains. After removing the Si$_3$N$_4$ film 63, a refractory metal film 66 is grown by CVD method thereon.

Molybdenum (Mo), tungsten (W), titanium (Ti), tantalum (Ta) or the like is suitable for the refractory metal film 66. The film consisting of such a metal material can be formed by not only CVD method, but sputtering or evaporation. However, considering formation of a thin film on the side wall of the U-shaped groove, CVD method is most suitable for forming the film. A refractory metal film can be grown on the entire surface of the substrate using a process gas such as WF$_6$/H$_2$ or WF$_6$/SiH$_4$.

Figure 6F:
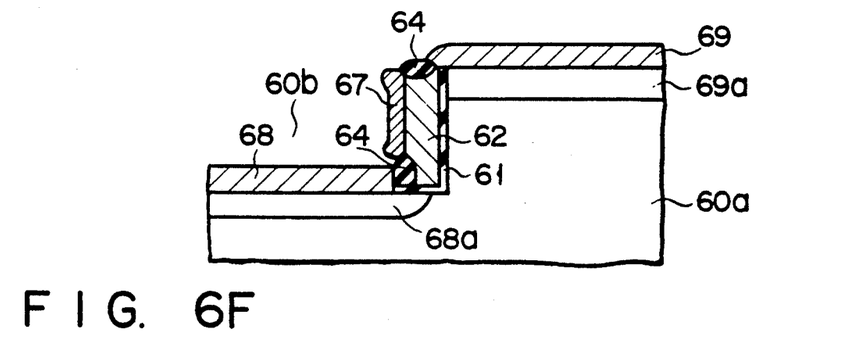

In the step shown in FIG. 6F, only the refractory metal film 66 directly contacting the Si substrate 60a and the polysilicon film 62 is selectively converted to a silicide by lamp annealing or the like. A portion (e.g., a portion contacting the oxide film 64) of the refractory metal film is not converted to a silicide is removed to form low-resistance electrodes 67, 68 and 69. Thereafter, the resultant structure is subjected to ion implantation or thermal diffusion to form n-type regions 68a and 69a each having an impurity concentration of, e.g., about $10^{18}$ cm$^{-3}$ to $10^{21}$ cm$^{-3}$.

As described above, a polysilicon film and an Si$_3$N$_4$ film are selectively removed and selectively oxidized (including enhanced oxidization) to form an oxide film spacer in a U-shaped groove. By using this spacer, low-resistance electrodes consisting of a refractory metal silicide film can be formed on a gate side wall, drain and source regions, respectively. Therefore, not only the gate series resistance, but also the contact resistance can be reduced as compared with a conventional transistor.

Figure 7:
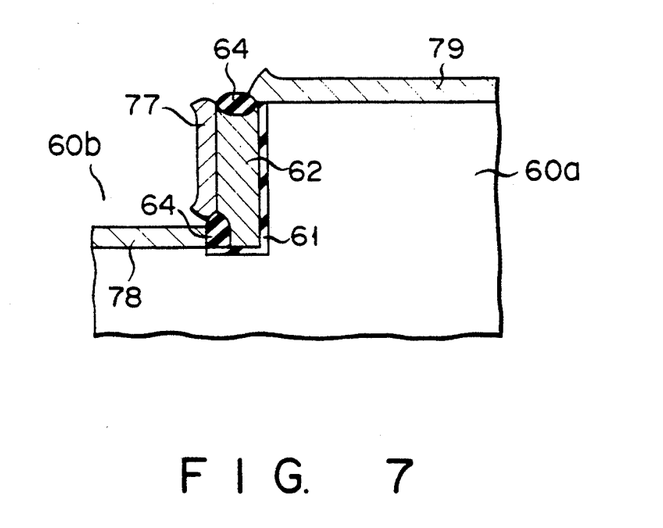
FIG. 7 is a sectional view showing a modification of the step for fabricating the SIT according to the third embodiment shown in FIGS. 6A to 6F.

FIG. 7 shows a modification of the step for fabricating the SIT according to the third embodiment shown in FIG. 6. That is, FIG. 7 shows the step shown in FIG. 6E, and steps before this step are the same as the steps shown in FIGS. 6A to 6D. Assuming that these previous steps are completed, the same reference numerals as in FIGS. 6A to 6D denote the same parts in FIG. 7, and its description will be omitted.

In the step shown in FIG. 6E, the refractory metal film 66 is deposited on the entire surface of the Si substrate. On the contrary, in the step in FIG. 7, refractory metal films 77, 78 and 79 are selectively grown on a gate side wall, drain and source regions by selective CVD method, respectively.

As such selective growth, WF$_6$/SiH$_4$ CVD system or the like is used. Since the refractory metal films are formed on only drain/source regions and gate side wall, a silicide pattern is not expanded to other regions during silicidation, and the step for removing the portion of the refractory metal film which is not converted to a silicide can be omitted.

Although an n-channel step cut type insulated gate SIT has been described above, the same effect as in the n-channel step cut type insulated gate SIT can be obtained in a p-channel step cut type insulated gate SIT having p-type drain and source regions.

Various characteristics of the step cut type insulated gate SIT fabricated in the steps of the present invention will be described.

Figure 8:
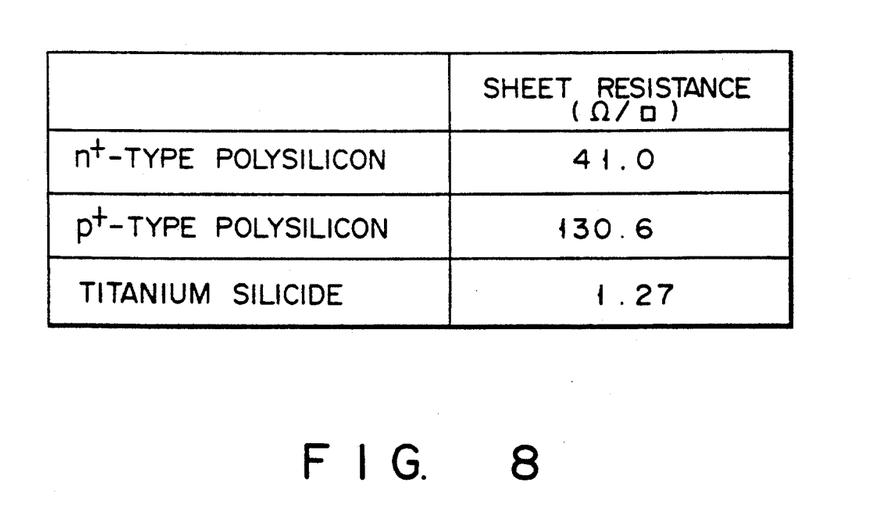
FIG. 8 is a table showing sheet resistances of a conventional gate electrode and a low-resistance gate electrode of the present invention.

FIG. 8 shows sheet resistances in which a conventional gate electrode consisting of polysilicon with a low-resistance gate electrode consisting of titanium silicide of the present invention are compared.

According to this result, the sheet resistance of the low-resistance gate electrode is improved to 1/30 that of the conventional n+-type polysilicon and to 1/100 that of the conventional p+ polysilicon.

A complementary MOS integrated circuit consisting of step cut type insulated gate SITs using conventional gates consisting of polysilicon and a complementary MOS integrated circuit consisting of step cut type insulated gate SITs using low-resistance gates of the present invention are evaluated by using a 31-stage ring oscillator. The evaluation results will be described below. Hereinafter, reference symbol A denotes the SIT CMOS circuit of the present invention; and B, the conventional SIT CMOS circuit.

Figure 9:
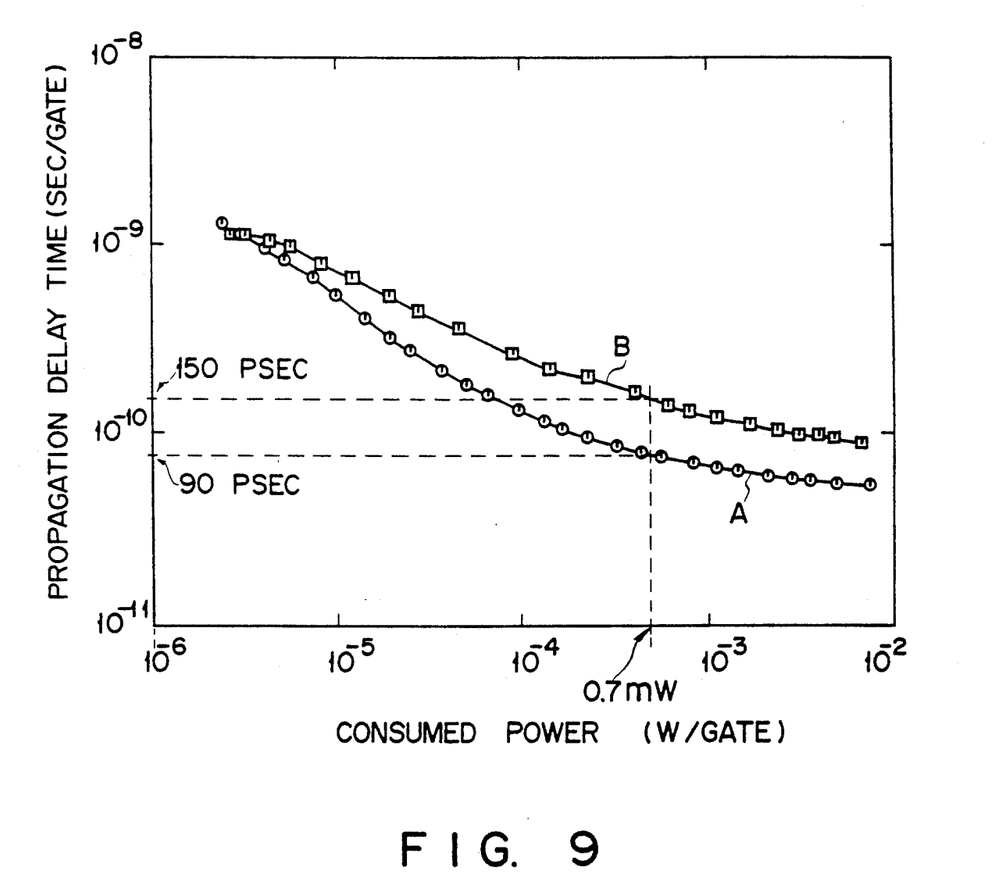
FIG. 9 is a graph showing a relationship between a propagation delay time a power dissipation in which a step cut type insulated gate SIT having a conventional gate electrode and that having a low-resistance gate electrode according to the present invention are compared.

FIG. 9 shows a relationship between the propagation delay time and the power dissipation.

When the power dissipation is 0.7 mW per gate, a propagation delay time of 90 psec per gate can be obtained in the SIT CMOS circuit of the present invention. However, in the conventional SIT CMOS circuit, a propagation delay time is 150 psec per gate. As a result, a switching time of the SIT CMOS circuit of the present invention is reduced to 60% or less of the conventional SIT CMOS circuit.

Next, a CMOS circuit consisting of step cut type insulated gate SITs using conventional polysilicon gates and a CMOS circuit consisting of step cut type insulated gate SITs using low-resistance gates and low-resistance source/drain regions of the present invention are evaluated by using a 31-stage ring oscillator. The evaluation results will be described below.

Figure 10:
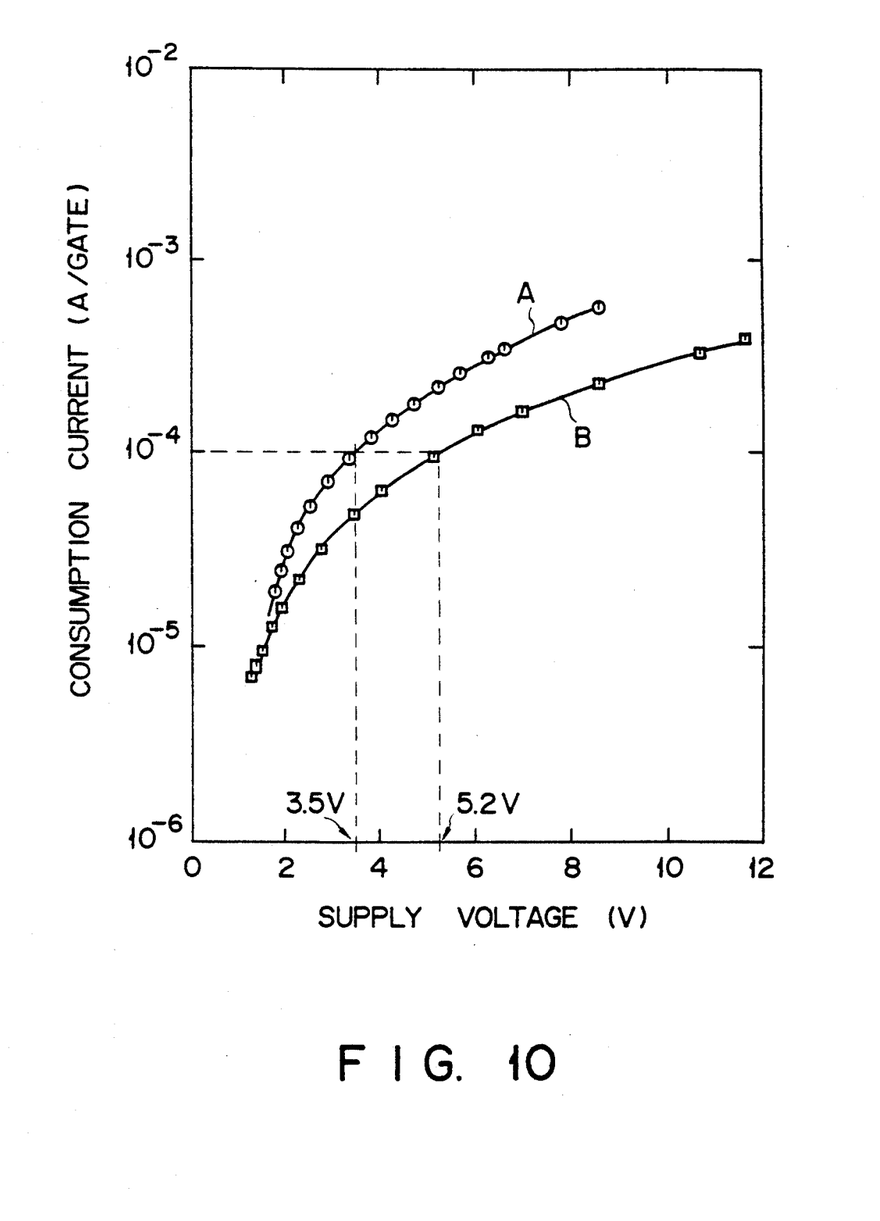
FIG. 10 is a graph showing a relationship between a supplied current and a supplied voltage, in which a step cut type insulated gate SIT having a conventional gate electrode and that having both a low-resistance gate electrode and a low-resistance source/drain electrode according to the present invention are compared.

FIG. 10 shows a relationship between the supplied current and the supplied voltage. For example, a supplied voltage required to flow a supplied current of 0.1 mA is 3.5 V in the SIT CMOS circuit of the present invention. In the conventional SIT CMOS circuit, a supplied voltage of 5.2 V is required. This is because the contact resistance is decreased to reduce a voltage drop at a contact portion. Thus a required supplied voltage of the present invention is lower than that of the conventional one in order to supply the same current.

Figure 11:
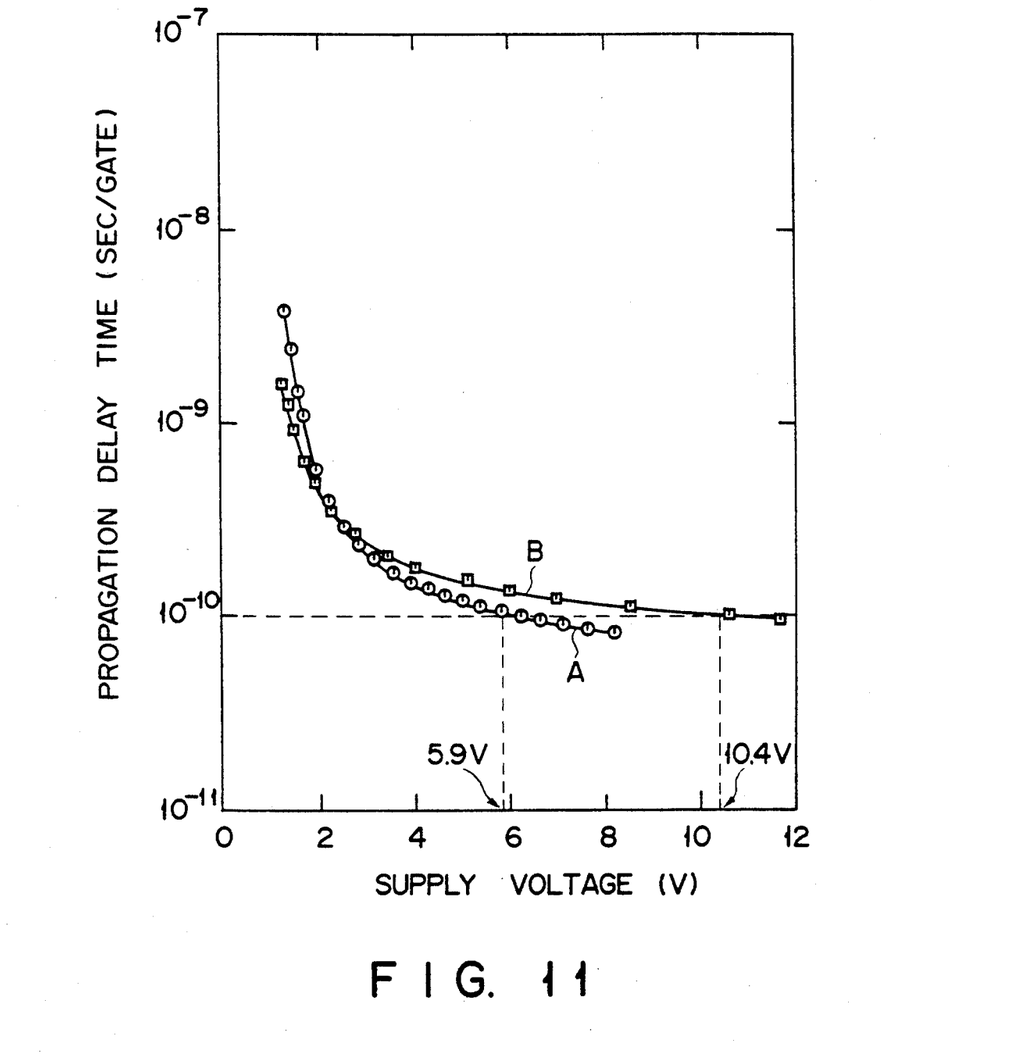
FIG. 11 is a graph showing a relationship between a propagation delay time and a supplied voltage, in which a step cut type insulated gate SIT having a conventional gate electrode and that having both a low-resistance gate electrode and a low-resistance source/drain electrode according to the present invention are compared.

FIG. 11 shows a relationship between the propagation time and the supplied voltage. For example, a supplied voltage of about 5.9 V is required for a propagation delay time of 100 psec per gate in the present invention, and a supply voltage of about 10.4 V is required in the conventional one. As a result, an SIT CMOS circuit of the present invention requires about half the supplied voltage of the conventional SIT CMOS circuit, and further, power dissipation of the present invention is ¼ smaller than that of a conventional one.

As described above, in a step cut type insulated gate SIT having a low-resistance electrode of the present invention, a gate series resistance can be improved to reduce the switching time. Since the contact resistance and series resistance of a source and a drain can be improved, the propagation delay time can be largely reduced. Power dissipation can be largely improved. The present invention is applied to a logic circuit requiring high speed and low power dissipation to provide great industrial advantages.

The present invention is not limited to the above embodiments. Various changes and modifications may be made without departing from the spirit and scope of the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a step cut type insulated gate static induction transistor, comprising the steps of:
   forming a U-shaped groove in one major surface of a semiconductor substrate;
   forming a thin insulating film on an entire surface of said semiconductor substrate;
   forming a polysilicon layer on said insulating film;
   forming a refractory metal layer on said polysilicon layer;
   removing said polysilicon layer and said refractory metal layer by anisotropic etching so as to retain said polysilicon layer and said refractory metal layer on only the side wall portion of said U-shaped groove; and
   forming a first main electrode in said one major surface and a second main electrode in a bottom portion of said U-shaped groove.

2. A method according to claim 1, further comprising the step of converting the refractory metal layer into a silicide.

3. A method of manufacturing a step cut type insulated gate static induction transistor, comprising the steps of:
   forming a U-shaped groove in one major surface of a semiconductor substrate;
   forming a thin insulating film on an entire surface of said semiconductor substrate;
   forming a polysilicon layer on said insulating film;
   removing said polysilicon layer by anisotropic etching so as to retain said polysilicon layer on only the side wall portion of said U-shaped groove;
   selectively forming a refractory metal layer on only said polysilicon layer; and
   forming a first main electrode in said one major surface and a second main electrode in a bottom portion of said U-shaped groove.

4. A method according to claim 3, further comprising the step of converting the refractory metal layer into a silicide.

5. A method according to claim 3, further comprising the steps of:
   forming a refractory metal layer on an entire surface of said semiconductor substrate;
   selectively converting said refractory metal layer on said polysilicon layer into a silicide; and
   removing those portions of said refractory metal layer which are not converted into a silicide.

6. A method of manufacturing a step cut type static induction transistor, comprising the steps of:
   forming a U-shaped groove in one major surface of a semiconductor substrate;
   forming a thin insulating film on an entire surface of said semiconductor substrate;
   forming a double-layered film consisting of a polysilicon layer and a silicon nitride layer on said insulating film;
   continuously removing said double-layered film by anisotropic etching so a to leave said double-layered film on only a side wall portion of said U-shaped groove;
   simultaneously performing enhanced oxidation of said polysilicon layer and local oxidation of silicon using said silicon nitride film as a mask, to form an oxide film;
   leaving said insulating film at part of a lower portion of a side wall of said polysilicon layer and an upper portion thereof in such a manner as to have a predetermined thickness;
   removing said silicon nitride film;
   forming a first main electrode in said one major surface and a second main electrode in a bottom portion of said U-shaped groove; and forming a refractory metal layer on said first main electrode, said second main electrode, and said polysilicon layer.

7. A method according to claim 6, further comprising the steps of:

forming a refractory metal layer on said semiconductor substrate;

selectively converting said refractory metal layer formed on said first main electrode, said second main electrode, and said polysilicon layer into a silicide; and removing those portions of said refractory metal layer which are not converted into a silicide.

8. A method according to claim 7, wherein said refractory metal layer is selectively formed on only said first and second main electrodes and said polysilicon layer.

9. A method according to claim 8, wherein said refractory metal layer is converted into a refractory metal silicide layer.

* * * * *